United States Patent [19]
Werner et al.

[11] Patent Number: 6,080,649
[45] Date of Patent: *Jun. 27, 2000

[54] FUSIBLE LINK IN AN INTEGRATED SEMICONDUCTOR CIRCUIT AND PROCESS FOR PRODUCING THE FUSIBLE LINK

[75] Inventors: Wolfgang Werner, München; Karlheinz Müller, Waldkraiburg; Holger Pöhle, Taufkirchen, all of Germany

[73] Assignee: Siemens Aktiengesellschaft, Munich, Germany

[*] Notice: This patent issued on a continued prosecution application filed under 37 CFR 1.53(d), and is subject to the twenty year patent term provisions of 35 U.S.C. 154(a)(2).

[21] Appl. No.: 08/780,492

[22] Filed: Jan. 8, 1997

[30] Foreign Application Priority Data

Jan. 8, 1996 [DE] Germany ............................ 196 00 398
Sep. 20, 1996 [DE] Germany ............................ 196 38 666

[51] Int. Cl.⁷ .................................................... H01L 21/44
[52] U.S. Cl. .......................... 438/601; 438/132; 438/281; 438/215
[58] Field of Search ..................................... 438/601, 132, 438/FOR 433, 215, 281, 333, 467; 257/665, 209, 529

[56] References Cited

U.S. PATENT DOCUMENTS

| | | |
|---|---|---|
| 4,045,310 | 8/1977 | Jones et al. ............................. 257/390 |
| 4,089,734 | 5/1978 | Bierig . |
| 4,198,744 | 4/1980 | Nicolay .................................. 438/601 |
| 4,209,894 | 7/1980 | Keen . |
| 4,536,948 | 8/1985 | Te Velde et al. ........................ 438/601 |
| 4,881,114 | 11/1989 | Mohsen et al. .......................... 257/530 |
| 5,903,041 | 5/1999 | La Fleur et al. ......................... 257/530 |

FOREIGN PATENT DOCUMENTS

| | | |
|---|---|---|
| 58-033865 | 2/1983 | Japan . |
| 60-053048 | 3/1985 | Japan . |
| 63-307758 | 12/1988 | Japan . |
| 1-295439 | 11/1989 | Japan . |
| 2 005 078 | 4/1979 | United Kingdom . |
| 2 075 751 | 11/1981 | United Kingdom . |
| WO88/03707 | 5/1988 | WIPO . |

*Primary Examiner*—John F. Niebling
*Assistant Examiner*—John Murphy
*Attorney, Agent, or Firm*—Herbert L. Lerner; Laurence A. Greenberg; Werner H. Stemer

[57] ABSTRACT

A fusible link in an integrated semiconductor circuit and a process for producing the fusible link contemplate the disposition of a fusible link, which is constructed with a cross-sectional constriction as a desired fusing point for its conductor track, in a void. A surface of the void and/or a bare conductor track can be covered with a protection layer, to prevent corrosion. The advantages of such a fusible link are a lower ignition energy and increased reliability. The fusible link may be used as a memory element of a PROM.

18 Claims, 4 Drawing Sheets

FUSIBLE LINK IN AN INTEGRATED SEMICONDUCTOR CIRCUIT AND PROCESS FOR PRODUCING THE FUSIBLE LINK

BACKGROUND OF THE INVENTION

1. Field of the Invention

The invention relates to a fusible link in an integrated semiconductor circuit, in which a conductor track has a cross-sectional constriction as a desired fusing point. The invention also relates to a process for producing a fusible link in an integrated circuit.

Integrated semiconductor circuits frequently have fusible links, which are used to introduce information into an already finished integrated circuit. This is carried out in such a way that the fusible link is either ignited or not ignited. In other words, a conductor track is either interrupted or not interrupted. Fusible links are used, for instance, to secure personal data in chip cards, to personalize standard components in motor vehicles, to set precise resistances or resistance ratios in analog circuits, and as a memory element in a PROM or for increasing the yield in memory components by cutting off defective memory cells.

Typically, a fusible link includes a conductor track that has a constriction of its cross section at the desired fusing point. That constricted cross section typically has a vertical extent of 0.1 to 1 $\mu$m and a horizontal length of 0.5 to 3 $\mu$m. The fusible link is embedded in one or more insulating layers, preferably silicon dioxide, depending on the layer sequence of the semiconductor component.

The interruption of the conductor track is carried out through the use of a current pulse that leads to melting open of the fuse and an insulation layer surrounding it. In a typical fuse made of polysilicon, approximately 20 mA at 12 V for a period of 5 to 10 $\mu$sec are required to achieve complete severing. Only about 1 to 10% of this ignition energy is needed for melting open the constricted conductor track itself. In other words, by far the majority of the ignition energy is dissipated to the surrounding insulation layers. A problem of fuses that are interrupted in this way is the danger of revitalization. In other words, the original conductivity may be partly reestablished as a result of the effects of temperature and voltage. Upon ignition, an approximately spherical region with a diameter of a few micrometers (typically 2 to 3 $\mu$m) melts open. That causes the destruction of the surrounding layers, and especially of the passivation layer above. As a result, contaminants such as alkali ions can penetrate more easily and can impair the reliability of the components of the integrated circuit.

Fusible links are also used as a memory element in PROM memory components. In them, a memory cell includes one fusible link and one diode. Since the performance on melt-through is very high and the attained reliability is low, such memories are alternatively made with so-called floating gate or SONOS structures. The Fowler-Nordheim tunneling effect or hot electron injection is used for programming. A disadvantage of the Fowler-Nordheim tunneling effect is the requisite high programming voltages of about 15 V. The writing times are about 10 $\mu$sec to 1 msec. In programming by hot electron injection, relatively high currents of a few milliamps are necessary, and writing times are about 10 $\mu$sec.

SUMMARY OF THE INVENTION

It is accordingly an object of the invention to provide a fusible link in an integrated semiconductor circuit and a process for producing the fusible link, which overcome the hereinafore-mentioned disadvantages of the heretofore-known devices and methods of this general type and in which the fusible link has improved reliability and does not impair reliability of the integrated circuit.

With the foregoing and other objects in view there is provided, in accordance with the invention, a fusible link in an integrated semiconductor circuit, comprising a void; and a conductor track having a cross-sectional constriction as a desired fusing point, the desired fusing point having at least one surface in the void.

In the invention, the desired fusing point of the fusible link is accommodated in a void. Therefore, only the constricted conductor track but no surrounding insulation layer needs to be melted open. Accordingly, only about 1 to 10% of the usual ignition energy is needed. This reduces the space requirement for the ignition transistors. The yield in the ignition operation is also improved. The danger of revitalization is averted. Since the melting process is limited to the conductor track, protection layers disposed above it in the integrated circuit, such as getter and barrier layers, are not destroyed, and therefore the reliability of the other components is not reduced.

However, in such a fusible link the danger can exist that harmful substances such as moisture will penetrate the void. Undesired reactions can occur at the walls of the void on which conductive structures may also be exposed, and on the fusible link itself, that impair the operability and reliability of the fusible link or of the circuit.

Therefore, in accordance with another feature of the invention, the fusible link and/or the void is covered with a protection layer, in order to prevent reactions, especially corrosion, at the bare surfaces of the conductor track and/or of the void. Suitable protection layers are, for instance, silicon oxide, silicon nitride, or a double layer of these materials. The layer may be applied by a known production process, such as PECVD. The layer thickness should be selected in accordance with requirements and is preferably in the range from 100 to 1000 nm.

In accordance with a further feature of the invention, the fusible link may be used as a memory element, by being connected in series with a diode or a drain of a selection transistor. A substantial advantage is that neither high current nor high voltage is necessary for programming. If the cross section of the desired fusing point is 0.4×0.7 $\mu m^2$ for a polysilicon track, for instance, then the fuse current is about 5 mA at a voltage of about 4 V. These values can be reduced further by choosing smaller cross sections. The programming time for such a cell is less than 1 $\mu$sec. A further advantage is that the stored data are secure, since erasure and rewriting in principle is no longer possible. The data cannot be altered by radiation or temperature storage, either.

With the objects of the invention in view there is also provided a process for producing a fusible link in an integrated circuit, which comprises producing a first layer on a semiconductor substrate; embedding a conductor track in the first layer; producing a cross-sectional constriction as a desired fusing point in the conductor track; producing a second layer on the first layer; producing an opening in the second layer in the vicinity of the desired fusing point; and creating a void in the first layer around the desired fusing point with an etching process.

With the objects of the invention in view there is additionally provided a process for producing a fusible link in an integrated circuit, which comprises producing a first layer on a semiconductor substrate; producing a second layer on the first layer, the second layer including a conductor track with a cross-sectional constriction as a desired fusing point and openings adjacent the desired fusing point; and creating a void in the first layer beneath the desired fusing point.

Other features which are considered as characteristic for the invention are set forth in the appended claims.

Although the invention is illustrated and described herein as embodied in a fusible link in an integrated semiconductor circuit and a process for producing the fusible link, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1–5 are fragmentary, diagrammatic views of a semiconductor substrate illustrating the production of a first embodiment of a fusible link, wherein FIGS. 1 and 3 are plan views and FIGS. 2, 4 and 5 are cross-sectional views; and FIGS. 6–10 are fragmentary, diagrammatic views of further embodiments of the fusible link, wherein FIG. 8 is a plan view and FIGS. 6, 7, 9 and 10 are cross-sectional views.

DESCRIPTION OF THE PREFERRED EMBODIMENTS

Figure 1:
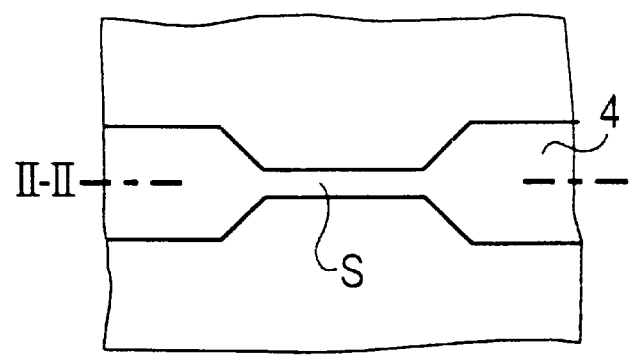
Figure 2:
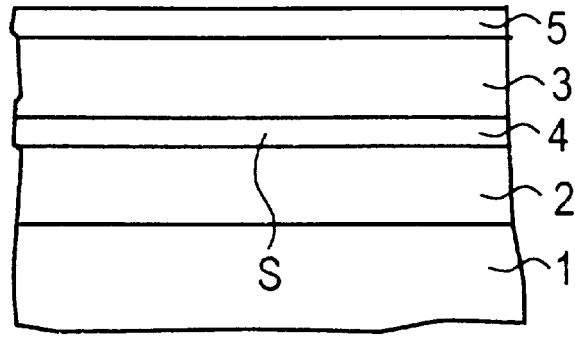

Referring now to the figures of the drawings in detail and first, particularly, to FIGS. 1 and 2 thereof, there is seen one lower and one upper insulation layer 2, 3 which are located on a semiconductor substrate 1 and which surround a conductor track 4. The lower and upper insulation layers 2, 3, which are preferably made of silicon oxide, together form a first layer. As can be seen from FIG. 1, the preferably polysilicon conductor track 4 embedded in the first layer has a cross-sectional constriction, which is created in this case by the reduction of its width. This cross-sectional constriction represents a desired fusing point S of the conductor track 4. A second layer 5 which, for instance, is again made of polysilicon (but is not shown in FIG. 1) is applied over the upper insulation layer 3.

Figure 3:
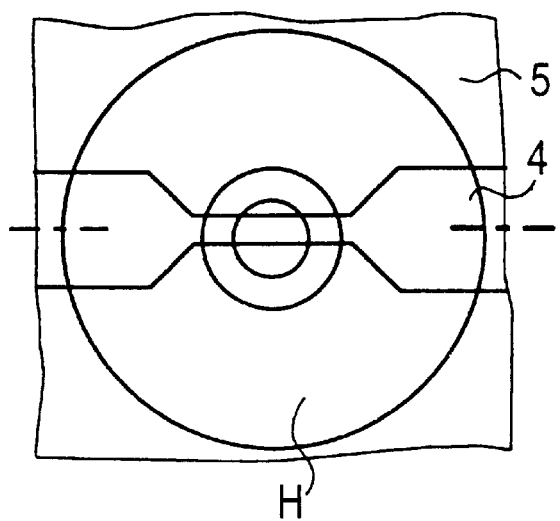
Figure 4:
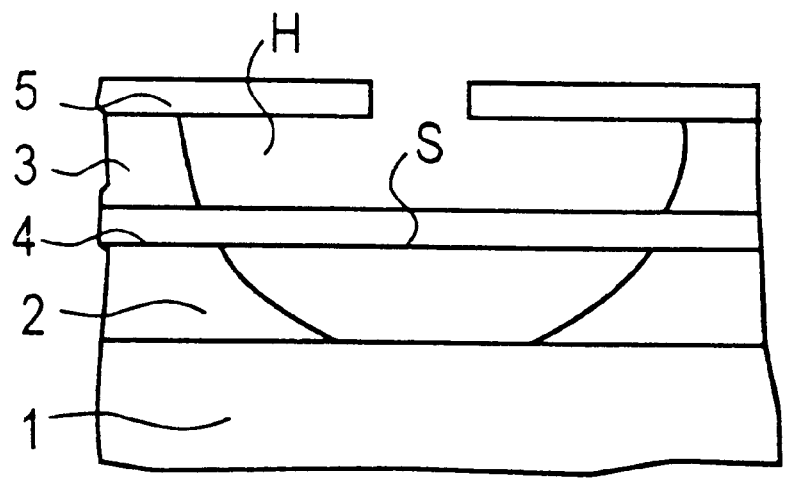

As is seen in FIGS. 3 and 4, an opening is made in the second layer 5, preferably directly above the desired fusing point S, for instance in an anisotropic etching process using a photoresist mask. Next, a void H is created in the underlying first layer 2, 3, in such a way that the desired fusing point S is located within this void. An isotropic etching process which can be used for this purpose extends selectively to the conductor track material and to the second layer. This creates a void H with a diameter of approximately 1 to 3 μm.

Figure 5:
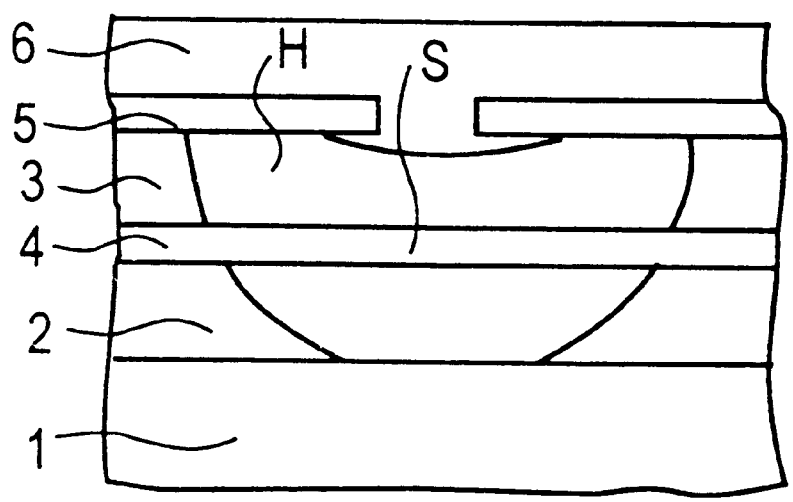

As FIG. 5 shows, next the void H can be closed by applying a cover layer 6 of silicon nitride, BPSG, TEOS, or some other suitable material, or a multiple layer that preferably contains these components. If BPSG is used as the cover layer 6, it can then be made liquid in a temperature step, thereby creating a smooth, strain-free, heavy-duty covering.

Figure 6:
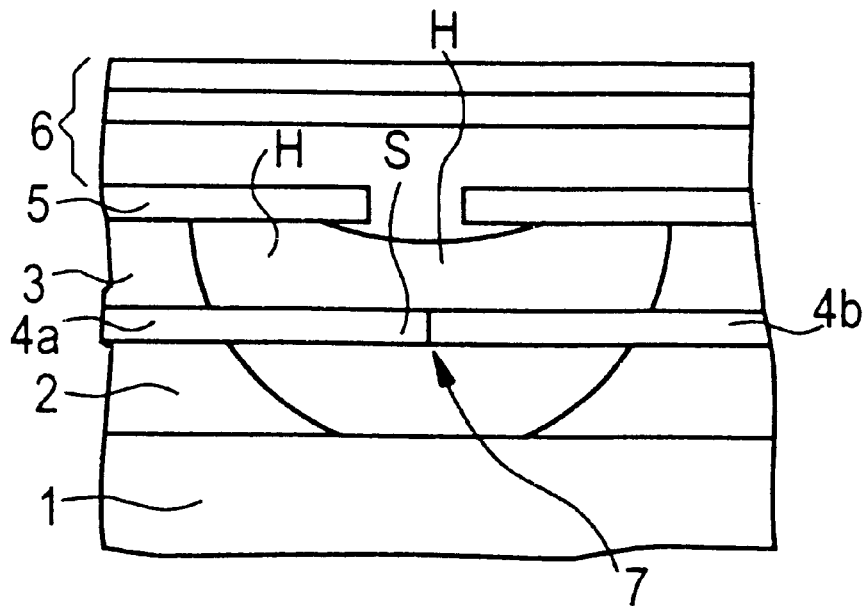

FIG. 6 shows that the fusible link can be used as explained above as a memory element. In one embodiment it is made as a unit with a diode, in such a way that the conductor track 4 itself has a pn junction 7 representing the diode, preferably in the immediate vicinity of the desired fusing point. The conductor track 4 accordingly includes a p-doped part 4b and an n-doped part 4a. The cover layer 6 may be a multiple layer, such as a covering of BPSG, TEOS and silicon nitride as is usual in semiconductor technology.

Figure 7:
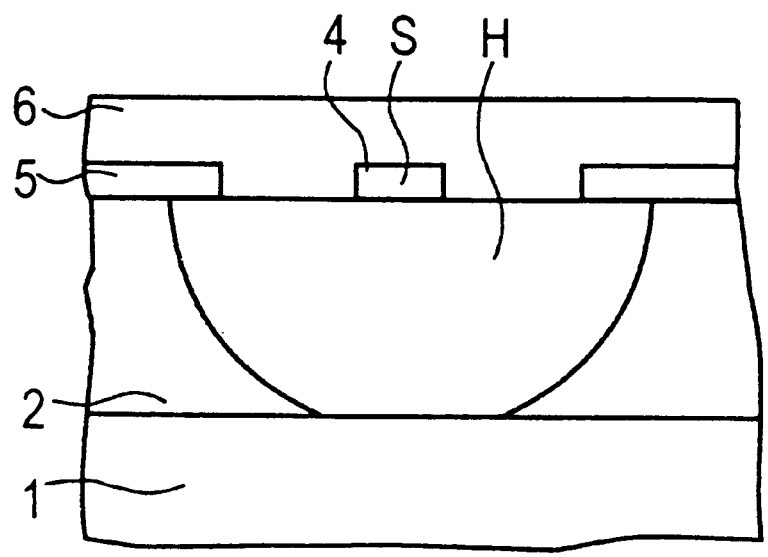

With regard to FIG. 7, the invention also includes an embodiment in which the desired fusing point S is not located entirely in the void H. Instead, only one surface of the conductor track 4 adjoins the void. The second layer 5 can then be identical with the layer from which the conductor track is made. Preferably, it is structured in such a way that it acts as a mask in the etching of the void. Directly next to the conductor track, the second layer 5 has the openings necessary for the etching process. This greatly simplifies the production process and the substantial advantages of the invention are still attained, to a somewhat reduced extent.

In the figure, the conductor track 4 extends at right angles to the plane of the drawing and the section is taken through the desired fusing point S. The lower surface of the desired fusing point S is located in the void H.

The fusible link may also be produced from some other conductive layer instead of polysilicon, for instance from aluminum or some other metal or alloy used for metallizing the integrated circuit. Any suitable method can then be employed for etching the void so that it is bare. If aluminum is used, then HF vapor can, for instance, be used.

The integrated circuit having the fusible link can be further processed as usual, since the closed void readily withstands the pressure exerted when it is installed in a plastic housing, for instance. The process for producing the fusible link itself is simple, since only a noncritical photo-technique and a simple wet etching step are needed.

Figure 8:
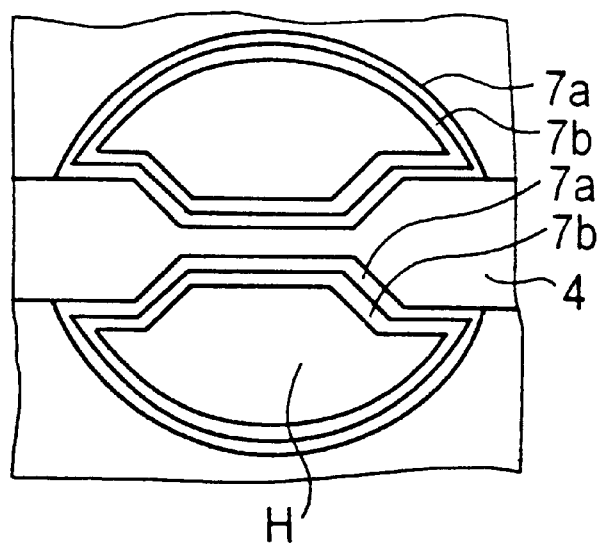
Figure 9:
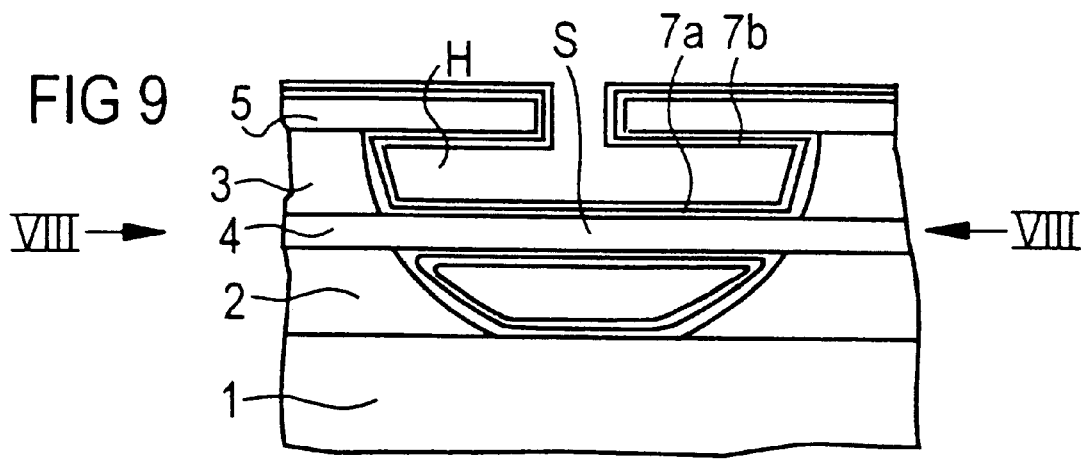

In the exemplary embodiment of FIGS. 8 and 9, one lower and one upper insulation layer 2, 3, which surround a conductor track 4, are located on a semiconductor substrate 1 as already described. The conductor track 4, for instance of polysilicon or aluminum, has a cross-sectional constriction which in this case is created by reducing its width and which represents the desired fusing point S of the conductor track 4. In this exemplary embodiment, a further or second layer 5 is applied to the upper insulation layer 3. The layer 5, by way of example, is likewise made of polysilicon or aluminum and it has an opening above the desired fusing point S. The void H is created through this opening with the aid of an essentially isotropic etching process, so that the desired fusing point S is located inside this void. A full-surface deposition of a protection layer having silicon oxide 7a and over it silicon nitride 7b is then carried out through the use of PECVD, and the exposed lower surface of the conductor track 4 is also covered with this protection layer.

Next, as described above, the void can be closed with a planarizing cover. The protection layer can also be removed again from surfaces outside the void H, or in other words from the upper surface of the second layer 5.

Figure 10:
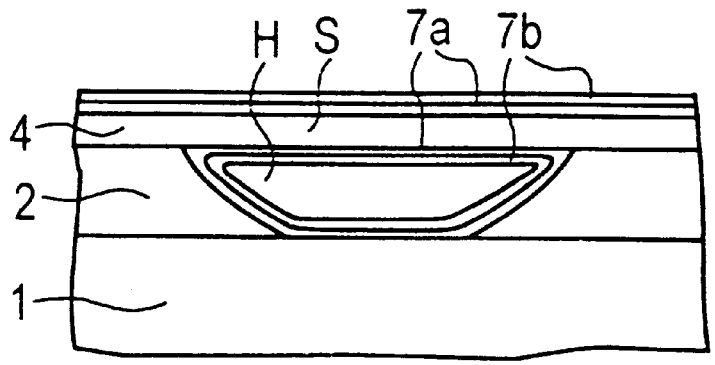

FIG. 10 shows a modification of the process described above, in which the void H is produced after structuring of the conductor track 4, in such a way that etching is carried out downward around the conductor track and especially around the desired fusing point, with the aid of a suitable photomask. The production of the protection layer 7a, 7b is then carried out as above.

We claim:

1. A process for producing a fusible link in an integrated circuit, which comprises:

producing a first layer on a semiconductor substrate;

embedding a conductor track in the first layer;

producing a cross-sectional constriction as a desired fusing point in the conductor track;

producing a second layer on the first layer;

producing an opening in the second layer directly above a void to be created; and performing an etching process through the opening in the second layer, thereby etching the first layer and creating the void in the first layer around the desired fusing point, whereby a wall of the void is formed partly by the first layer and partly by the second layer.

2. The production process according to claim 1, which comprises covering the opening in the second layer with a cover layer.

3. The production process according to claim 2, which comprises forming the cover layer of BPSG.

4. The production process according to claim 1, which comprises connecting the fusible link in a series circuit with a diode.

5. The production process according to claim 1, which comprises connecting the fusible link in a series circuit with a drain of a selection transistor.

6. The production process according to claim 4, which comprises producing a pn junction representing the diode in the conductor track inside the void.

7. The production process according to claim 1, which comprises applying a protection layer to a wall of the void after the creation of the void.

8. The production process according to claim 1, which comprises applying a protection layer to a bare surface of the conductor track after the creation of the void.

9. The production process according to claim 1, which comprises applying a protection layer to a wall of the void and to a bare surface of the conductor track, after the creation of the void.

10. A process for producing a fusible link in an integrated circuit, which comprises:

producing a first layer of an insulating material on a semiconductor substrate;

producing a second layer on the first layer, the second layer including a conductor track with a cross-sectional constriction as a desired fusing point and openings adjacent the desired fusing point; and creating a void in the first layer beneath the desired fusing point by etching the first layer, the walls of the void being formed at least partly by the first layer.

11. The production process according to claim 10, which comprises covering the opening in the second layer with a cover layer.

12. The production process according to claim 10, which comprises forming the cover layer of BPSG.

13. The production process according to claim 10, which comprises connecting the fusible link in a series circuit with a diode.

14. The production process according to claim 10, which comprises connecting the fusible link in a series circuit with a drain of a selection transistor.

15. The production process according to claim 13, which comprises producing a pn junction representing the diode in the conductor track inside the void.

16. The production process according to claim 10, which comprises applying a protection layer to a wall of the void after the creation of the void.

17. The production process according to claim 10, which comprises applying a protection layer to a bare surface of the conductor track after the creation of the void.

18. The production process according to claim 10, which comprises applying a protection layer to a wall of the void and to a bare surface of the conductor track, after the creation of the void.

* * * * *